US009839142B2

(12) United States Patent
Patterson et al.

(10) Patent No.: US 9,839,142 B2
(45) Date of Patent: Dec. 5, 2017

(54) VACUUM PALLET REFLOW

(71) Applicant: IMI USA, INC., Tustin, CA (US)

(72) Inventors: Timothy P. Patterson, Mission Viejo, CA (US); William Lutap, Tustin, CA (US); Roger Nguyen, Irvine, CA (US)

(73) Assignee: IMI USA, Inc., Tustin, CA (US)

( * ) Notice: Subject to any disclaimer, the term of this patent is extended or adjusted under 35 U.S.C. 154(b) by 0 days.

(21) Appl. No.: 14/820,025

(22) Filed: Aug. 6, 2015

(65) Prior Publication Data

US 2015/0342061 A1 Nov. 26, 2015

Related U.S. Application Data

(63) Continuation of application No. 13/457,670, filed on Apr. 27, 2012, now abandoned.

(60) Provisional application No. 61/479,512, filed on Apr. 27, 2011.

(51) Int. Cl.
*B23K 3/08* (2006.01)
*H05K 3/34* (2006.01)
*B23K 1/20* (2006.01)
*B23K 1/00* (2006.01)
*B23K 1/008* (2006.01)

(52) U.S. Cl.
CPC ............... *H05K 3/34* (2013.01); *B23K 1/008* (2013.01); *B23K 1/0016* (2013.01); *B23K 1/203* (2013.01); *B23K 3/08* (2013.01); *H05K 3/3494* (2013.01); *H01L 2924/0002* (2013.01); *H05K 2203/04* (2013.01); *H05K 2203/085* (2013.01)

(58) Field of Classification Search
None
See application file for complete search history.

(56) References Cited

U.S. PATENT DOCUMENTS

| | | | |
|---|---|---|---|
| 4,845,843 | A | 7/1989 | Babcock |
| 5,447,886 | A | 9/1995 | Rai |
| 5,607,609 | A | 3/1997 | Sakuyama et al. |
| 5,899,446 | A | 5/1999 | Thompson |
| 6,161,749 | A | 12/2000 | Bastacky et al. |
| 6,334,569 | B1 | 1/2002 | Yoshimura |
| 6,742,701 | B2 | 6/2004 | Furuno et al. |
| 2005/0218197 | A1 | 10/2005 | Mochizuki |

FOREIGN PATENT DOCUMENTS

| | | |
|---|---|---|
| DE | 20102064 U1 | 6/2001 |
| DE | 20300224 U1 | 3/2003 |
| JP | 2009226456 A | 10/2009 |

OTHER PUBLICATIONS

International Search Report for PCT/US2012035407 dated Aug. 1, 2012.

*Primary Examiner* — Devang R Patel
(74) *Attorney, Agent, or Firm* — Harness, Dickey & Pierce, PLC

(57) ABSTRACT

A soldering device and method of soldering are disclosed. The device may include at least one soldering pallet assembly. The pallet assembly may be subjected to a first atmosphere configured within the soldering pallet assembly and a second atmosphere configured external to the pallet assembly, the second atmosphere is an ambient atmosphere. At least one solder element may be positioned within the first atmosphere, and the solder element may be configured to attach an electrical component to an integrated circuit chip that is positioned within the pallet assembly.

10 Claims, 5 Drawing Sheets

VACUUM PALLET REFLOW

CROSS-REFERENCE TO RELATED APPLICATIONS

This application is a continuation application claiming priority to U.S. Utility application Ser. No. 13/457,670 filed on Apr. 27, 2012 which claims priority to U.S. Provisional Patent Application 61/479,512 filed on Apr. 27, 2011, the contents of which are hereby incorporated by reference in their entirety.

BACKGROUND

Power integrated circuit (IC) chip assembly and manufacturing generally includes applying a controlled amount of a soldering element, such as but not limited to, a soldering paste to attach at least one electrical component to a substrate. The electrical components may include, but are not limited to, transistors (such as, but not limited to, metal oxide semiconductor field-effect transistor, MOSFET), diodes and resistors. The IC chip is assembled with the electrical component using the soldering paste or solder element. Once the chip is assembled, it is then subjected to a controlled heat, which melts the soldering element, thereby forming a permanent electrical connection between the component and the substrate. The application of heat is typically conducted in a reflow oven, which melts the solder without damaging the adjoining areas and the attached electrical components.

Due to decreases in package size of the IC chip assembly and with the increase of power levels in electrical applications, the IC chip package requires near perfect void-free soldered connections. However, the quality of the connections may be negatively affected by the introduction of unwanted gases released during the application of heat in the fusing process. These unwanted gases are typically enhanced due to the solders used in the process and should be minimized to protect the environment and operators by limiting harmful emissions.

However, the use of the reflow ovens alone may not decrease the voids and may result in additional unwanted voids in the soldered connection. In certain applications, such as, automotive battery controllers, these voids may cause overheating of the IC chip where a high power MOSFET is used to control increased power levels. In such applications, the process of assembling and manufacturing the IC MOSFET chip may include the application of a vacuum source to aid in the removal of any voids or air pockets in the soldered connection.

Generally, such an application of vacuum is conducted through the use of a stand-alone unit, which includes three separate and distinct process chambers for pre-heating, soldering and cooling. The three separate process chambers are divided within an enclosure and may be loaded either manually by an operator or automatically with manipulators. The systems include a vacuum system for applying a vacuum within the cabinet. The vacuum is applied to a process atmosphere in each process chamber. These systems are costly and cannot be used with nor do they require an additional reflow oven pallet/conveyor system. Thus, there is a need in IC MOSFET chip manufacturing for a cost effective device and method for applying a vacuum during the soldering process while utilizing a standard reflow oven system.

SUMMARY

The present disclosure relates to vacuum soldering of integrated circuit (IC) chips. A method may include configuring at least one vacuum pallet to receive at least one integrated circuit substrate. The vacuum pallet may be configured to selectively engage a standard reflow oven conveyer for applying heat to melt a solder element configure on the IC chip. The vacuum pallet may be fluidly connected to a vacuum source to provide a differential pressure within a sealed cavity within a portion of the vacuum pallet. A thermocouple may be selectively connected to at least one area of the vacuum pallet to monitor at least one temperature associated with the vacuum pallet. The at least one area may include the sealed cavity and an external surface of the vacuum pallet.

The substrate may be configured to receive at least one surface mount device (SMD) electrical component and a solder element for permanently attaching the component to the substrate. The soldering element may be a paste, a preform or other known solder element used in the manufacturing of integrated circuit (IC) chips. Once the component is configured on the substrate and the soldering element is introduced, the assembly is subjected to the application of at least one elevated heat temperature. The elevated temperature is applied to the at least one vacuum pallet upon introduction into a standard reflow oven, the vacuum pallet assembly may be configured with an ambient atmosphere. Additionally, at least one vacuum is applied to the at least one vacuum pallet at a predetermined temperature to remove any air pockets or voids in the soldered joint and providing a different atmosphere to the vacuum pallet assembly.

The at least one vacuum pallet may be selectively removable from a standard reflow oven conveyer belt. The at least one vacuum pallet may be sealed from the at least one ambient atmosphere during the application of the at least one elevated heat element.

BRIEF DESCRIPTION OF THE DRAWINGS

Referring now to the drawings, illustrative embodiments are shown in detail. Although the drawings represent some embodiments, the drawings are not necessarily to scale and certain features may be exaggerated, removed, or partially sectioned to better illustrate and explain the present invention. Further, the embodiments set forth herein are exemplary and are not intended to be exhaustive or otherwise limit or restrict the claims to the precise forms and configurations shown in the drawings and disclosed in the following detailed description.

DETAILED DESCRIPTION

Figure 1:
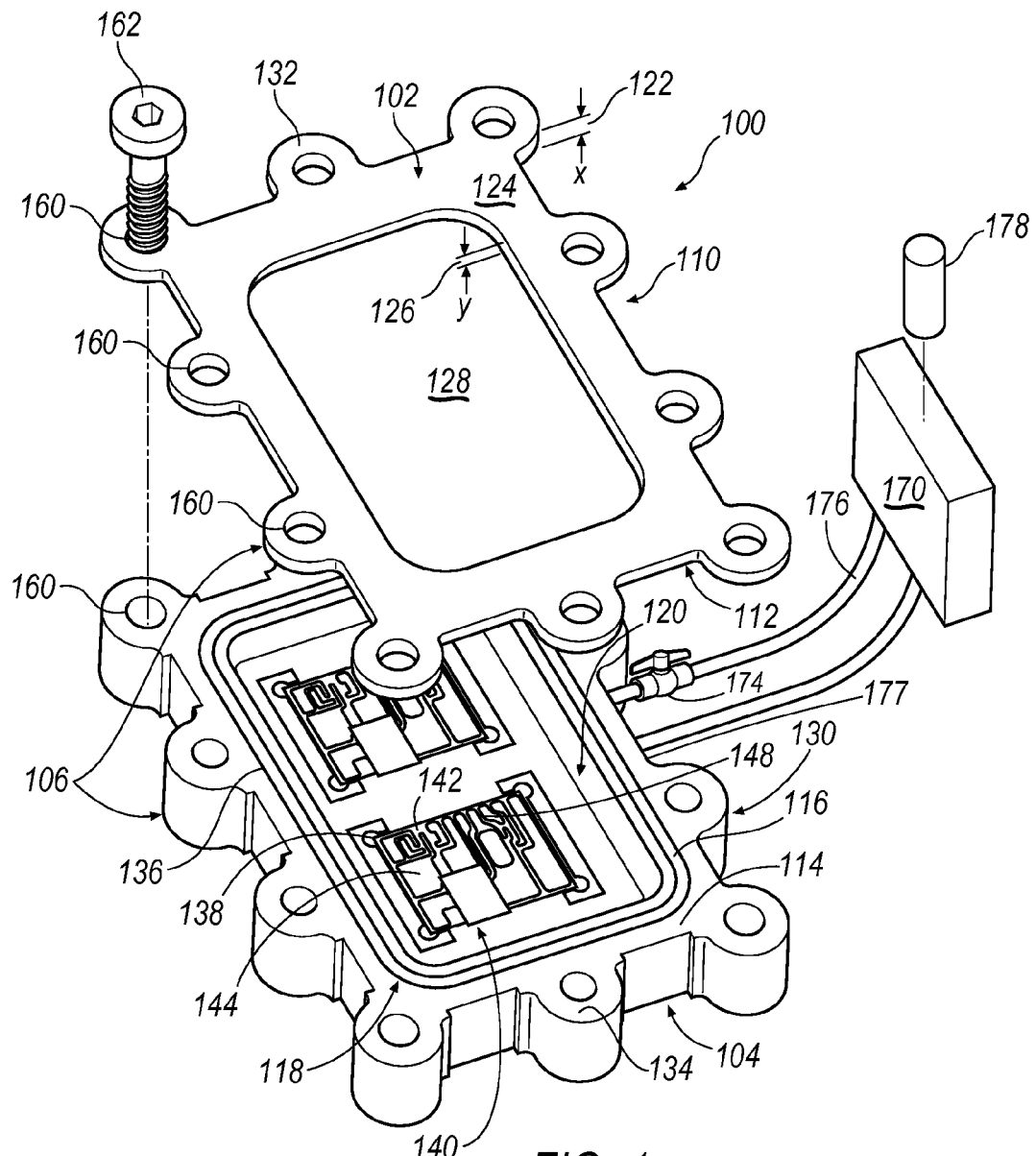
FIG. 1 is an isometric view of an exemplary vacuum pallet assembly.

Referring now to the discussion that follows and also to the drawings, illustrative approaches to the disclosed systems and methods are shown in detail. Although the drawings represent some possible approaches, the drawings are not necessarily to scale and certain features may be exaggerated, removed, or partially sectioned to better illustrate and explain the present disclosure. Further, the descriptions set forth herein are not intended to be exhaustive or otherwise limit or restrict the claims to the precise forms and configurations shown in the drawings and disclosed in the following detailed description.

Reference in the specification to "an exemplary illustration" and "example" or similar language means that a particular feature, structure, or characteristic described in connection with the exemplary approach is included in at least one illustration. The appearances of the phrase "in an illustration" or similar type language in various places in the specification are not necessarily all referring to the same illustration or example.

According to various exemplary illustrations described herein, a device and method are disclosed. Specifically, an exemplary vacuum solder pallet and method of use are disclosed. The vacuum solder pallet may include a pallet base and a pallet cover. The pallet cover may be configured to seal a cavity configured in the pallet base from an external ambient atmosphere. The ambient atmosphere may be configured in a standard reflow oven. The cavity may include a predetermined configuration for supporting at least one substrate and at least one associated electrical component configured to engage the substrate prior to introduction into the reflow oven.

The vacuum solder pallet is illustrated as an aluminum part having at least one fitting extending from a side wall. The fitting may be connected to at least one of a vacuum system, a venting system and a thermo-couple. The pallet cover may be configured with a plurality of cross-sectional areas, which may allow varying rates of cooling to the vacuum solder pallet. At least one of the pallet base and the pallet cover may include a recess for receiving a sealing element. The sealing element may be a high temperature resistant O-ring constructed from a high temperature polymer or compressible metal material, such as, but not limited to copper or other sealing type material.

The exemplary method may include at least one of the following steps in no specific order. A step of configuring an IC chip substrate with a soldering element and at least one surface mount device electrical component, thereby creating a substrate assembly. A step of positioning the substrate assembly in a cavity configured in a pallet assembly, the pallet assembly may include at least one of a pallet base and a pallet cover. A step of positioning at least one thermo couple adjacent the pallet base. A step of attaching the pallet cover to the pallet base with at least one fastener, such as, but not limited to, a bolt or a clamp. A step of configuring a carrier selectively with the pallet base may be included. The carrier may be configured for selective attachment with a conveyor in a standard reflow oven. Additionally, the pallet base may also be configured to directly attach to the conveyor in the standard reflow oven depending on the specific application. A step of connecting at least one vacuum source to at least one of the pallet base and the pallet cover may be included. A step of selectively applying at least one temperature gradient to the pallet assembly. A step of creating a pressure differential between the cavity of the pallet assembly and the external ambient atmosphere in the standard reflow oven. A step of applying at least one additional temperature gradient to the pallet assembly may be included. The additional temperature gradient is different than the at least one temperature gradient previously discussed.

Additionally, the exemplary method may include a step of applying a pre-vacuum to the pallet assembly where a vacuum is applied throughout a complete reflow process. Specifically, the IC assembly may be positioned within the pallet assembly and a continuous vacuum is applied to the pallet assembly as the pallet assembly is cycled through the standard reflow oven. Where the continuous vacuum is used the vacuum may be in the form of an initial vacuum pull with a valve locking the pallet assembly at a negative pressure condition or a direct hose may be connected to the pallet assembly and a continuous vacuum will be drawn on the pallet assembly as it is transported through the standard reflow oven. It should be known that other vacuum application configurations are contemplated. These configurations may include a two chamber pallet assembly where a vacuum is applied to a vacuum chamber and upon reaching a predetermined temperature a valve or rupture element, configured between the two chambers, will open to equalize the positive pressure in a working chamber with the negative pressure in the vacuum chamber. The exemplary method utilizes the standard reflow oven, thereby eliminating the need for a vacuum specific oven.

Turning to the exemplary illustrations, FIG. 1 is an isometric view of an exemplary vacuum pallet assembly 100. The vacuum pallet assembly 100 has a top surface 102, a bottom surface 104 and a vertical wall 106 interconnecting the two surfaces 102, 104 and extending around the pallet assembly 100. It should be known that the top surface 102 and the bottom surface 104 may be interchangeable and merely defines orientation of the pallet assembly 100 as illustrated. Additionally, the pallet assembly 100 may include a vacuum pallet base 130 and vacuum pallet cover 110.

The pallet base 130 and the pallet cover 110 are configured to mate together at a pallet cover mating surface 112 and a pallet base mating surface 114, such that at least one soldering cavity 120 is formed within the pallet assembly 100. The surfaces 112, 114 may include a sealing member 116 that is configured on at least one of the surfaces 112, 114, providing an air tight connection. The sealing member 116 may be positioned in a retaining groove 118 that is configured on at least one of the mating surfaces 112, 114. The seal 116 may be constructed of a temperature tolerant material, such as, but not limited to a neoprene, a polymer, a copper and a metal matrix or other sealing material that is able to withstand a predetermined elevated temperature of at least 250° C.

The pallet assembly 100 may be constructed from materials configured to withstand the predetermined elevated temperature, while maintaining structural integrity for introducing a pressure differential to an internal area when the pallet cover 110 and the pallet base 130 are sealed together. The material may be an aluminum alloy, a bronze, a copper alloy or other known metal matrix material. Additionally, the material may be a composite, such as but not limited to plastics, neoprene, silicone, rubber or other known composite materials.

The pallet cover 110 may be a rigid structure that is configured to cover the pallet base 130. The pallet cover 110 may include a first cross sectional thickness 122 that extends about a perimeter 124 and a second cross-sectional thickness 126 configured at an area 128 internally to the outer perimeter 124 of the top surface 102. At least one mounting tab 132 is configured on the outer perimeter 124 and corresponds to at least one mounting tab 134 configured on a base perimeter 136. The base perimeter 136 may extend around the pallet base 130, the base perimeter 136 may provide the mating surface 114 for mating with the vacuum pallet cover 110. The pallet cover 110 first and second cross-sectional thicknesses 122, 126 may provide or vary the surface areas of the pallet assembly to encourage heat dissipation. Specifically, the area 128 may be a recessed area that both increases the surface area of the pallet cover 110 and decreases the overall weight of the pallet assembly 100. It should be known that the vacuum pallet cover 110 is not limited to the two cross-sectional thicknesses 122, 126 and may include other thicknesses suitable for proper heat dissipation and weight savings.

The at least one soldering cavity 120 may be configured to receive at least one IC chip 140. The configuration within the soldering cavity 120 may include a recess 138 or other positioning element to position the IC chip 140 in a specific location. The IC chip 140 may include a substrate 142, at least one surface mount device 144 configured on the substrate 142 and at least one solder element 148 configured to secure the surface mount device 144 to the substrate 140 after an elevated temperature is applied. The at least one solder element 148 may be a solder preform, a solder paste or other known IC chip soldering material. The substrate 140, surface mount device 144 and the soldering element make up the IC chip 140 and in operation, the IC chip 140 may be positioned within the cavity 120 and the pallet cover 110 is secured to the pallet base to seal the soldering cavity 120 from an ambient atmosphere of a standard reflow oven 200 (see FIG. 2).

The pallet assembly may include at least one aperture 160 that extends through the mounting tab 132 and into mounting tab 134. The at least one aperture 160 may be include at least one thread (not shown) for receiving a fastener 162. The fastener 162 may be, but is not limited to a bolt, a clamp or other known selective securing element. As illustrated in FIG. 1, the exemplary pallet assembly 100 includes a plurality of mounting tabs 132, 134, which may create a scalloped shape on the vertical wall 106. This scalloped shape may reduce the overall weight of the pallet assembly 100, while providing additional heat dissipation properties by increasing the surface area of the pallet assembly 100.

Additionally, as illustrated in FIG. 1, the pallet assembly may be directly connected to a vacuum pump 170 through at least one vacuum fitting 172 extending from at least one of the pallet cover 110 and the pallet base 130. A vacuum line 176 may be configured between the vacuum fitting 172 and the vacuum pump 170 depending on the application. The vacuum fitting 172 may include a valve 174 for selective application of a negative pressure to the soldering cavity 120. The vacuum pump 170 may also include a filtration element 178, the filtration element 178 may aid in the removal of any gases that are drawn from the melting of the solder element 148 prior to release into a standard atmosphere, such as, but not limited to an o-zone (not illustrated). It should be known that the negative pressure may be continuously supplied as the pallet assembly is transported through the standard reflow oven 200 (see FIG. 2) or the negative pressure may be created and maintained by closing the valve 174 and disconnecting the vacuum pump 170.

Figure 2:
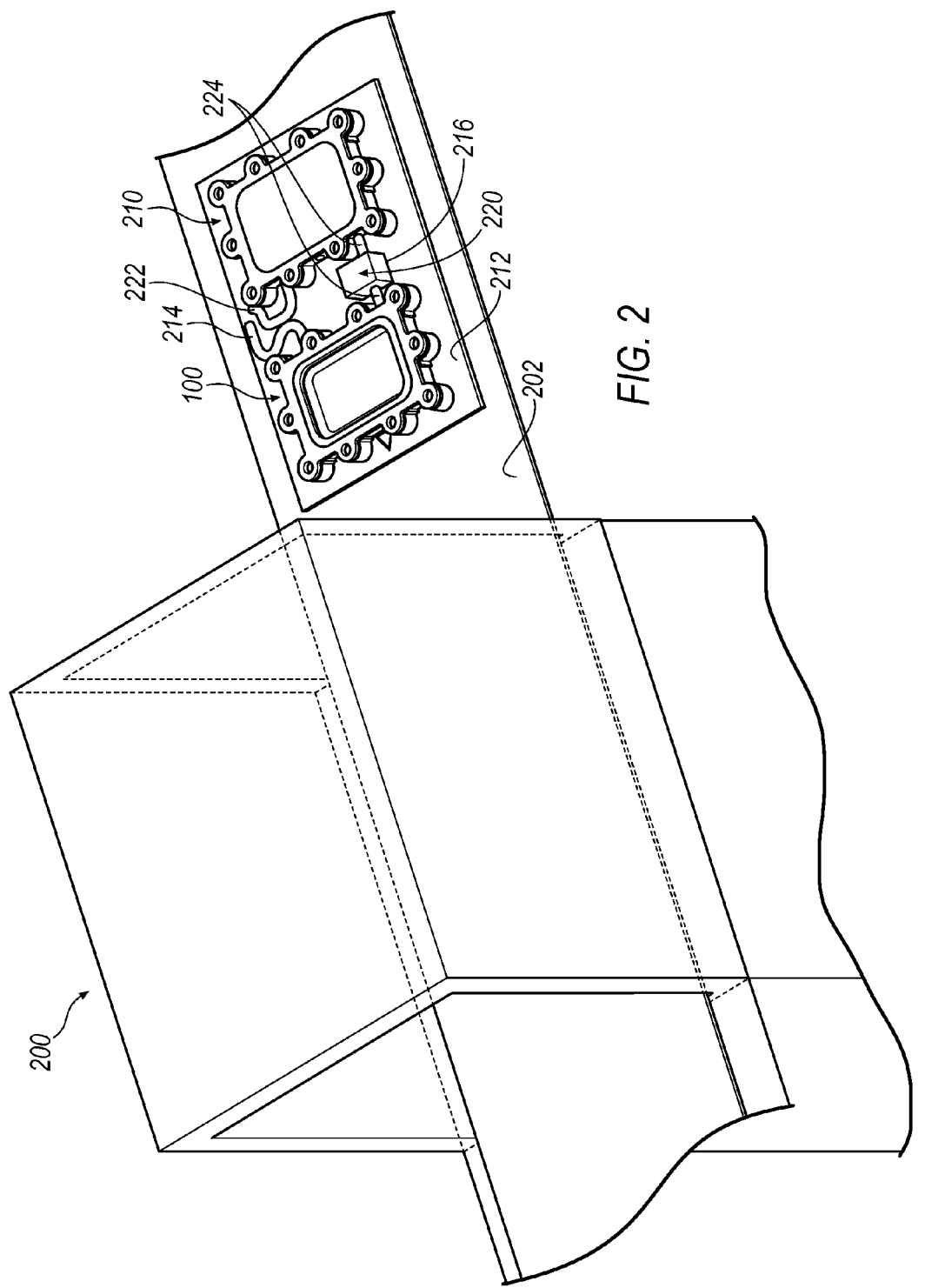
FIG. 2 is an isometric view of an exemplary vacuum pallet assembly configured with an external thermocouple on a standard reflow oven conveyer carrier.

Additionally, as illustrated in FIG. 2 a vacuum chamber pallet 210 may be fluidly connected to the pallet assembly 100. The vacuum chamber pallet 210 may be any vessel configured to maintain a negative pressure while subjected to at least one elevated temperature. The vacuum chamber pallet 210 may provide the negative pressure during the heating process within the standard reflow oven 200, such that a vacuum is applied to the vacuum chamber pallet 210 by the vacuum pump 170 (see FIG. 1) prior to positioning within the oven 200. Once the negative pressure is achieved in the vacuum chamber pallet 210, the vacuum pump 170 (see FIG. 1) is disconnected. The pallet assembly 100 and connected vacuum chamber pallet 210 is then transported into the oven 200. Once a predetermined elevated temperature is achieved within the oven 200, a temp sensor switch (not shown) activates an air valve 220, which opens to fluidly connect the vacuum chamber pallet 210 thereby applying a negative pressure to the soldering cavity/chamber 120 (see FIG. 1). The negative pressure may remove entrapped gases, which create inclusions or voids at the soldered 148 (see FIG. 1) connection between the SMD 144 (see FIG. 1) and the substrate 142 (see FIG. 1). It should be known that the air valve 220 may be configured as a rupture disc that opens or dissolves when a predetermined temperature is achieved.

As further illustrated in FIG. 2, an exemplary vacuum pallet assembly 100 is configured on a carrier 212. The carrier 212 may support the pallet assembly 100, the fluidly connected vacuum chamber pallet 210 and an air valve housing 218 for introduction into the standard reflow oven 200. The elements 100, 210 and 218 may be affixed to the carrier 212 by any known method, such as, but not limited to bolting, adhering and bonding. However, it should be realized that the carrier 212 is not required and at least one of the pallet assembly 100 and the vacuum chamber pallet 210 may be positioned directly to an oven conveyor 202. The oven conveyor 202 is configured to support and transport at least one of the pallet assembly 100, the vacuum chamber pallet 210 and the carrier 212 into the oven 200 where at least one heat gradient (not shown) is applied to at least the pallet assembly 100. The carrier 212 also provides a mounting surface for at least one thermocouple 214 extending from at least one of the pallet assembly 100 and the vacuum chamber pallet 210.

In operation, the exemplary configuration illustrated in FIG. 2 demonstrates the vacuum pallet assembly 100 positioned adjacent the vacuum chamber pallet 210 on the carrier 212. The air valve 220 is illustrated being configured between the vacuum pallet assembly 100 and the vacuum chamber pallet 210 with at least one connection hose 224 connecting at least one of the vacuum pallet assembly 100 and the vacuum chamber pallet 210 to the air valve 220. In this configuration, the vacuum pump 170 (see FIG. 1) is removably connected to the vacuum chamber pallet 210 through a vacuum hose 222. Thus, after a predetermined negative pressure may be applied to the vacuum chamber pallet 210 the vacuum hose 222 is disconnected from the vacuum pump 170 (see FIG. 1) and the carrier 212 may be allowed to enter the standard reflow oven 200. Additionally, it should be known that the carrier 212 may be of any rigid material having heat resistant properties.

Figure 3:
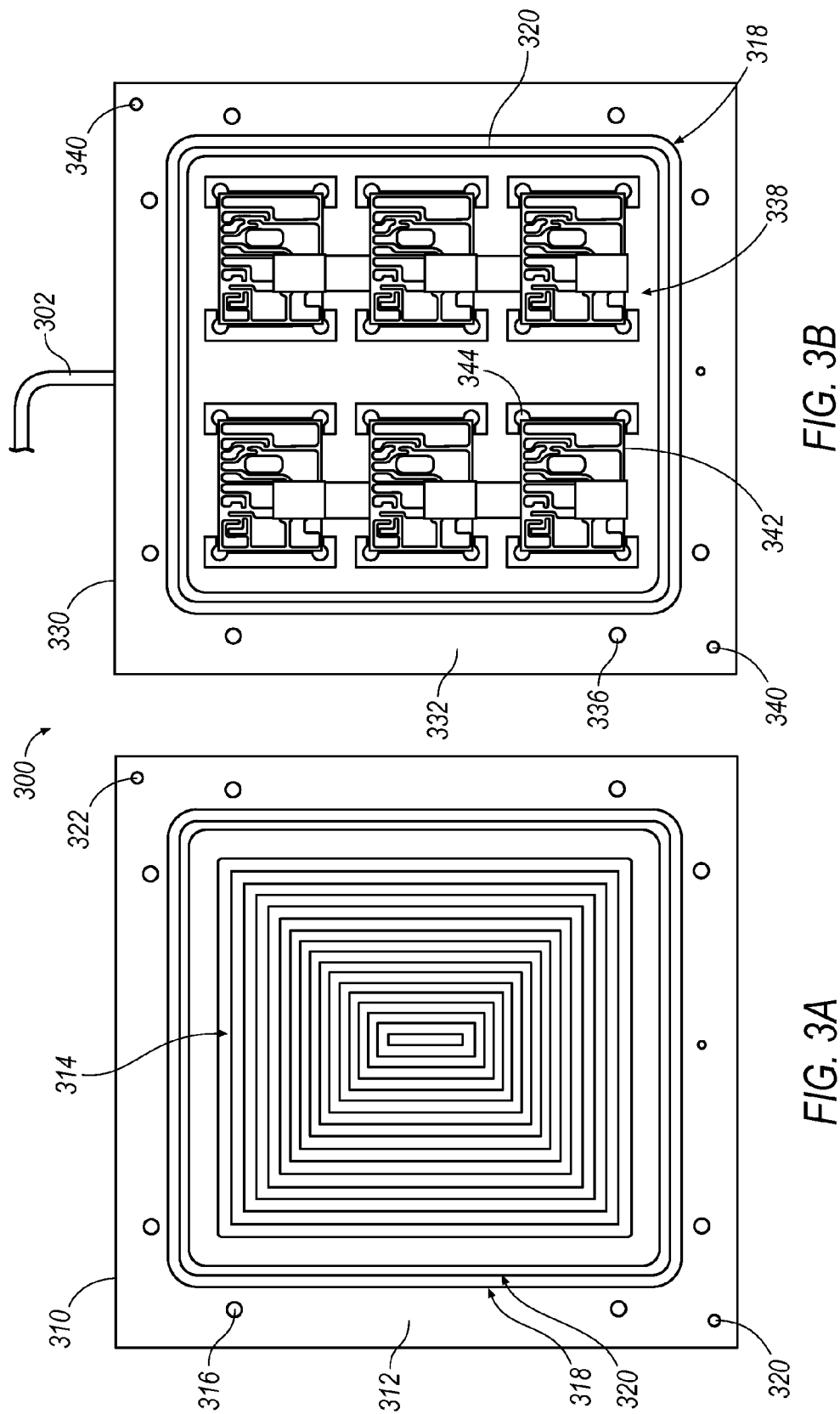
FIGS. 3A and 3B are top views of an exemplary vacuum assembly including at least one vacuum connection.

FIGS. 3A and 3B illustrate an exemplary vacuum assembly 300 including at least one vacuum connection 302. The exemplary vacuum pallet assembly 300 may include a vacuum pallet cover 310 and a vacuum pallet base 330. The pallet cover 310 may include a cover mounting surface 312 configured to mate with a base mounting surface 332. The pallet cover 310 may include a recessed area 314 configured in the cover mounting surface 312. The recessed area 314 may be an area where the material thickness may be reduced thereby creating an alcove in the surface 312. Additionally, the pallet cover 310 may include at least one mounting aperture 316 that may be configured to receive at least one fastener element 162. The fastener element 162 may be configured to extend through the pallet cover 310 and into a corresponding aperture 336 configured in the vacuum pallet base 330. The aperture 336 may be configured to threadingly engage the fastener element 162. The pallet cover 310 may also include at least one alignment pin 322 extending from the cover mounting surface 312. The at least one alignment pin 322 may be configured to engage an alignment aperture 340 configured in the base mounting surface 332.

The base mounting surface 332 and the cover mounting surface 312 may be configured with a sealing element 320 that may be positioned in a sealing channel 318. FIGS. 3A and 3B both illustrate the seal 320 and the channel 318 being configured on both the surfaces 312, 332. However, it is not necessary to include the seal 320 on both surfaces 312, 332, provided that the seal 320 is present.

With specific reference to FIG. 3B an exemplary pallet base 330 is illustrated having a working cavity 338 configured inward of the base mounting surface 332. The working cavity 338 may include at least one IC chip 342 positioning element 344. However, as illustrated, a plurality of positioning elements 344 may be configured within the working cavity 338. The IC chip 342 may be configured the same as the IC chip 142 (see FIG. 1) with at least one SMD, such as, but not limited to a MOSFET electrical component, which is soldered to the substrate. A vacuum line supply 302 is provided to provide a negative pressure within the working cavity 338. It should be known that the working cavity 338 may be separated into more than one working cavity 338. Additionally, it should be known that the negative pressure is a pressure that is lower than the ambient atmosphere pressure such that gasses emitted from the welding process are pulled away from the soldered joint, thereby preventing inclusions or voids.

Figure 4:
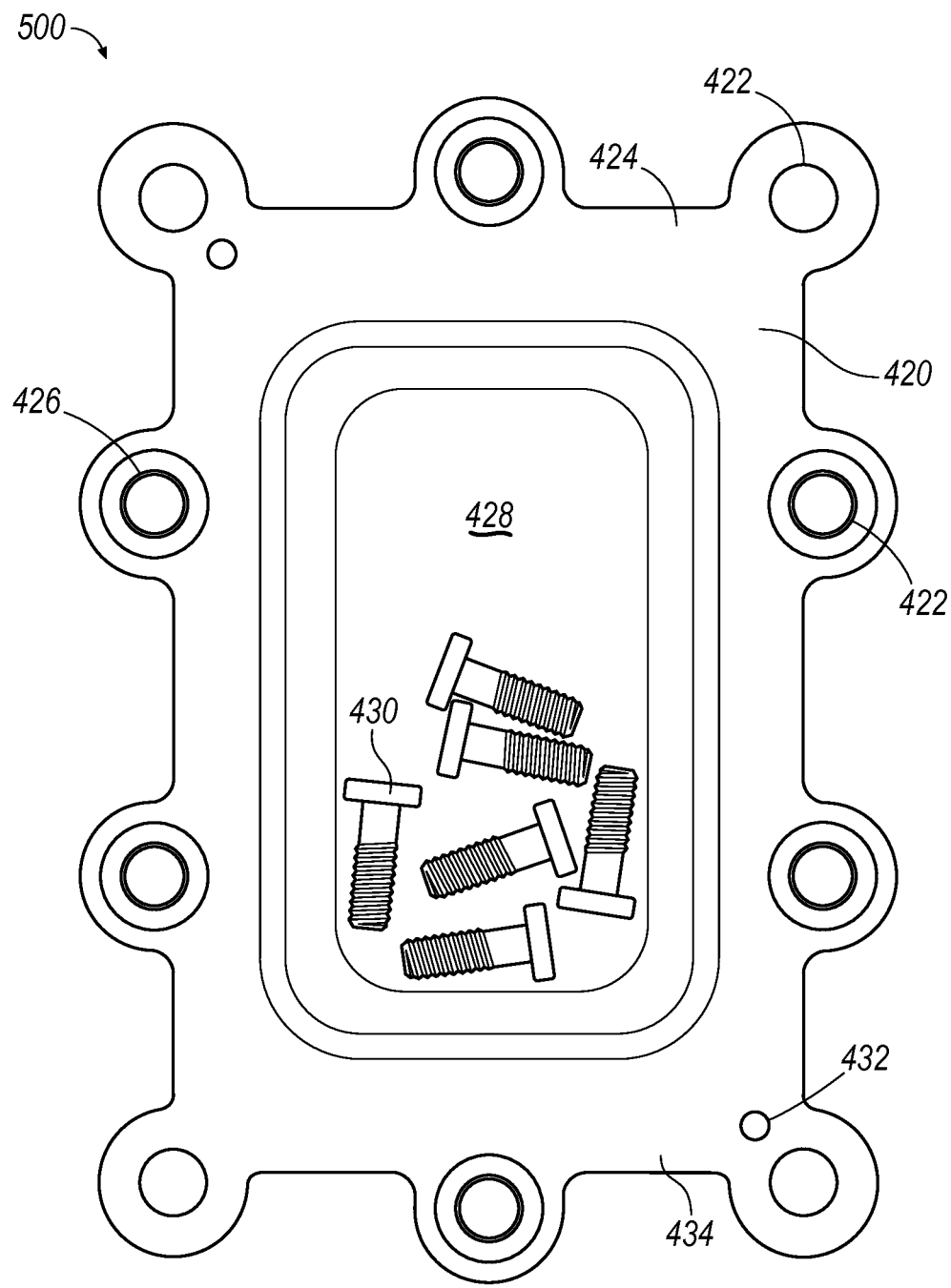
FIG. 4 is a top view of an exemplary vacuum pallet cover with mounting bolts.
Figure 5:
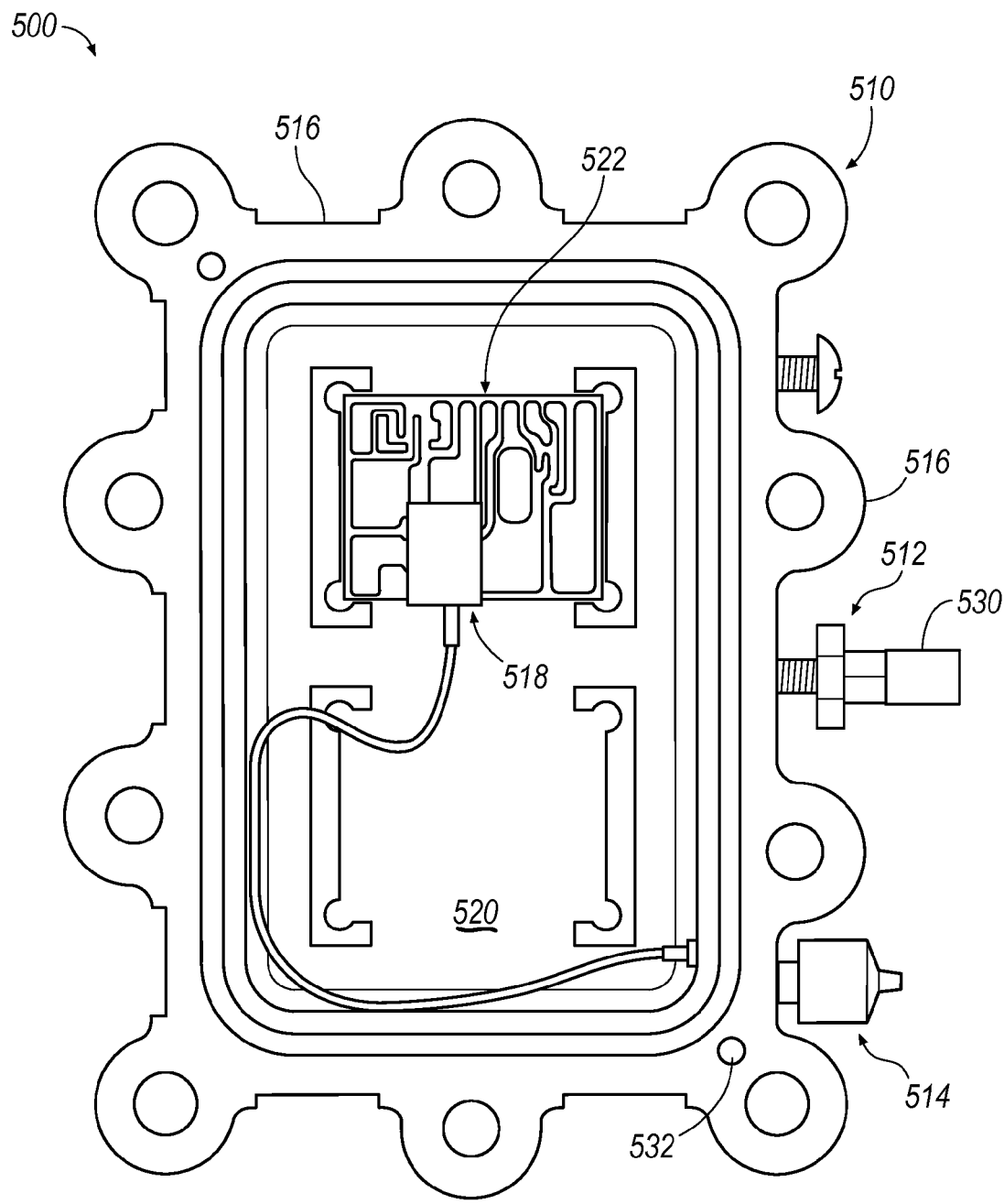
FIG. 5 is a top view of an exemplary vacuum pallet base with a thermo-couple attached.

FIGS. 4 and 5 illustrate an exemplary vacuum pallet cover 420 and a vacuum pallet base 510, which makes up an exemplary pallet assembly 500. With specific reference to FIG. 4, a plurality of apertures 422 are configured along an outer perimeter 424 of the cover 420. At least one of the plurality of apertures 422 may be configured with a reinforcing sleeve 426. The reinforcing sleeve provides additional support to the pallet cover 420 and may prevent the pallet cover from deforming when the pallet cover 420 is torqued to the pallet base 510. Additionally, the pallet cover 420 may include a recessed area 428 configured inwardly of the at least one apertures 422. As illustrated, the recessed area 428 provides a storage area for at least one fastener 430 when the pallet cover 420 is removed from the pallet base 510. With continued reference to FIGS. 4 and 5, at least one locating element 432 is configured in a mating surface 434 of the pallet cover 420 and a corresponding at least one locating element 532 is configured in the pallet base 510. The locating element may be a pin and aperture or other known locating element 432.

Turning now to FIG. 5, an exemplary working cavity 520 is illustrated with a thermocouple 518 positioned adjacent an IC chip 522. The thermocouple 518 may be in communication with a thermocouple fitting 514, which is illustrated as being configured in a vertical side wall 516 of the pallet base 510. The thermocouple fitting 514 may be connected to a temperature device (not illustrated) for monitoring an internal temperature when the pallet assembly 500 is positioned in the standard reflow oven 200, as discussed above. Additionally, a vacuum fitting 512 is illustrated as being configured in the vertical side wall 516 of the pallet base 510. As discussed above, the vacuum fitting 512 is configured to be fluidly connected to the vacuum pump 170 (see FIG. 1) for providing a negative pressure within the working cavity 520. In operation, the negative pressure may be applied once the thermocouple 518 measures a predetermined elevated temperature. The elevated temperature preheats the substrate 142 (see FIG. 1), the SMD 144 (see FIG. 1) and the solder element 148 (see FIG. 1) to facilitate outgassing of any gasses created during the oven process.

As previously discussed, a valve 530 may be configured in-line with the vacuum fitting 512 and the vacuum pump 170 (see FIG. 1). The valve 530 may serve to selectively isolate the working cavity from the vacuum line 176 (see FIG. 1) until the predetermined temperature is achieved and a vacuum is requested by the thermocouple 518. Additionally, the valve 530 may completely isolate the working cavity 520 once the vacuum is engaged and a negative pressure is present within the working cavity 520.

In operation, an exemplary pallet assembly may be selected. The assembly may be configured with the IC chip, which includes the substrate, SMD and solder element. The assembly 100 is then sealed thereby creating an area for a first pressure differential when a vacuum is applied to the assembly. The pallet assembly may then be inserted into a standard reflow oven having an ambient atmosphere, the oven being configured to elevate the temperature of the ambient atmosphere to a predetermined value. The predetermined value is provided based on the solder element and the desired melting properties of the solder element. This is generally determined by the process parameters, which are dependent on a specific temperature gradient as the pallet assembly moves through the oven. Upon reaching the predetermined temperature, the soldering element liquefies to join the substrate with the SMD and the negative pressure pulls the gasses and compresses the molten solder to minimize any voids or inclusions. The oven will now reduce the heat and thereby allowing the pallet assembly to dissipate heat from the surfaces. As discussed above, the vacuum may be continuously applied, applied after a pre-heat and applied through a separate chamber, adjacent the pallet assembly.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

Reference in the specification to "one example," "an example," "one approach," or "an application" means that a particular feature, structure, or characteristic described in connection with the example is included in at least one example. The phrase "in one example" in various places in the specification does not necessarily refer to the same example each time it appears.

The present disclosure has been particularly shown and described with reference to the foregoing illustrations, which are merely illustrative of the best modes for carrying out the disclosure. It should be understood by those skilled in the art that various alternatives to the illustrations of the disclosure described herein may be employed in practicing the disclosure without departing from the spirit and scope of the disclosure as defined in the following claims. It is intended that the following claims define the scope of the disclosure and that the method and apparatus within the scope of these claims and their equivalents be covered thereby. This description of the disclosure should be understood to include all novel and non-obvious combinations of elements described herein, and claims may be presented in this or a later application to any novel and non-obvious combination of these elements.

Moreover, the foregoing illustrations are illustrative, and no single feature or element is essential to all possible combinations that may be claimed in this or a later application. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope. The scope of the invention is limited solely by the following claims.

What is claimed is:

1. A system for manufacturing printed circuit boards, comprising:
   an oven configured to elevate a temperature therein;
   a portable solder pallet assembly configured to be selectively inserted into said oven, said portable solder pallet assembly including:
   a vacuum solder pallet mounted to a portable carrier and defining a selectively sealable solder chamber configured to temporarily mount a printed circuit board therein; and
   a vacuum chamber pallet mounted to said portable carrier and defining a chamber that is fluidly connected to said vacuum solder pallet so as to provide a source of negative pressure relative to a pressure in said vacuum solder pallet chamber.

2. The system of claim 1, wherein said chamber in said vacuum chamber pallet is configured to be fluidly connected to a vacuum that is not mounted on said portable carrier.

3. The system of claim 1, wherein said portable solder pallet assembly further comprises a valve configured to selectively open and close the fluid communication path between said solder chamber and said source of negative pressure.

4. The system of claim 3, further comprising a temperature sensing device configured to generate a signal to open said valve in response to sensing a predetermined elevated temperature.

5. The system of claim 1, wherein said solder pallet assembly is configured to expel gas from said solder chamber in response to said source of negative pressure.

6. The system of claim 1, further comprising a mount inside said vacuum solder pallet chamber that is configured to temporarily secure a printed circuit board during a heating process.

7. The system of claim 1, wherein said vacuum solder pallet is capable of maintaining a sealed configuration while subject to an elevated temperature of at least 250 degrees C.

8. The system of claim 1, wherein said vacuum solder pallet comprises at least two members that are selectively secured together to form said solder chamber and a sealing member positioned between said at least two members to maintain a sealed chamber.

9. The system of claim 8, wherein said sealing member is made from a material that is capable of maintaining a sealed configuration of said solder chamber while subject to an elevated temperature of at least 250 degrees C.

10. The system of claim 9, wherein said sealing member material is selected from the group comprising: neoprene, a polymer, a copper, and a metal matrix.

* * * * *